United States Patent [19]
Fujita

[11] Patent Number: 5,467,058
[45] Date of Patent: Nov. 14, 1995

[54] AMPLIFIER CIRCUIT WITH A STABILIZED BIAS IN ITS OUTPUT STAGE

[75] Inventor: Shinichi Fujita, Hamamatsu, Japan

[73] Assignee: Yamaha Corporation, Japan

[21] Appl. No.: 296,712

[22] Filed: Aug. 26, 1994

[30] Foreign Application Priority Data

Sep. 1, 1993 [JP] Japan .................................. 5-240387

[51] Int. Cl.$^6$ ........................................................ H03F 3/26
[52] U.S. Cl. ............................................ 330/267; 330/265
[58] Field of Search ..................................... 330/263, 265, 330/267, 268, 266

[56] References Cited

U.S. PATENT DOCUMENTS

| | | | |
|---|---|---|---|
| 4,521,740 | 6/1985 | Nakayana | 330/267 |
| 4,922,208 | 5/1990 | Susak et al. | 330/255 |
| 5,049,834 | 9/1991 | Kasai | 330/268 X |

FOREIGN PATENT DOCUMENTS 54-12031  5/1979  Japan .
1497712  7/1989  U.S.S.R. .

Primary Examiner—Steven Mottola
Attorney, Agent, or Firm—Graham & James

[57] ABSTRACT

An amplifier circuit with a stabilized bias in its output stage includes a push-pull type output-circuit having a first transistor and second transistor connected to each other in Darlington connection, a third transistor and a fourth transistor respectively operating complementarily with the first transistor and the second transistor. The third transistor and fourth transistor are connected to each other in Darlington connection, and the second transistor and fourth transistor are connected in series as output stage transistors between terminals of a DC power supply source. The amplifier circuit further includes a current detection circuit having current detection resistance inserted between either the first transistor or the third transistor and the DC power supply source and detecting idling current of either the first transistor or the third transistor by means of terminal voltage of the current detection resistance, and a biasing circuit responsive to output of the current detection circuit for controlling the idling current of either the first transistor or the third transistor in a negative feedback fashion.

2 Claims, 4 Drawing Sheets

AMPLIFIER CIRCUIT WITH A STABILIZED BIAS IN ITS OUTPUT STAGE

BACKGROUND OF THE INVENTION

This invention relates to a push-pull type amplifier circuit and, more particularly, to an aplifier circuit with a stabilized bias in its output stage.

In an output stage of a conventional power amplifier, idling current is generally subjected to a substantial change due to factors including irregularity in characteristics of elements and, accordingly, adjustment of idling current is required. When, for example, a transistor in an output stage has been replaced, readjustment of idling current to compensate for change in bias resistance is required. Besides, compensation due to temperature change by thermal coupling is indispensable for prevention of thermal runaway and a special circuit design for this purpose is required.

For achieving this purpose, a technique, for example, been proposed (e.g., Japanese Patent Publication No. Sho 54-12031, FIGS. 3 and 4) to detect voltage across emitter resistance of an output transistor and control base bias of the output transistor on the basis of the detected voltage.

However, resistance inserted in the emitter of the push-pull type output transistor is one way for achieving operational balance and hence is of an extremely small value of 1 ohm or less. Accordingly, change in detected voltage due to the emitter resistance is very small in the case of a small current operation, though it may not be so in the case of a large amplitude operation, and this makes it difficult to maintain accuracy in the bias control. Increase in the emitter resistance for increasing detected voltage, on the other hand, poses the problems of reduction in the drive capacity and increase in output impedance of the amplifier.

In sum, in a conventional circuit design of an output stage of a power amplifier, adjustment of idling current and temperature compensation by thermal coupling are indispensable and a special circuit design is required for achieving this purpose. In the method for carrying out the bias control on the basis of voltage across the emitter resistance of the output transistor, an accurate control is difficult. Increase in emitter resistance for realizing an accurate control results in deterioration of amplifier characteristics such as increase in the output impedance.

It is, therefore, an object of the invention to provide a push-pull type amplifier circuit capable of obviating adjustment of idling current without bringing about deterioration in the amplifier characteristics and without using a large type diode for bypassing purpose.

SUMMARY OF THE INVENTION

For achieving the object of the invention, an amplifier circuit comprises a push-pull type output circuit including a first transistor and a second transistor connected to each other in Darlington connection, a third transistor and a fourth transistor respectively operating complementarily and connected to each other in Darlington connection, and said second transistor and said fourth transistor being connected in series as output stage transistors between terminals of a DC power supply source, current detection means comprising current detection resistance inserted between either said first transistor or said third transistor and said DC power supply source and detecting idling current of either said first transistor or said third transistor on the basis of terminal voltage of said current detection resistance, and biasing means responsive to output of said current detection means for controlling the idling current of either said first transistor or said third transistor in a negative feedback fashion.

According to the invention, by inserting the current detection resistance between a transistor in the initial Darlington stage (the first or third transistor) of the Darlington connection in the push-pull type output stage and enabling automatic negative feedback control of bias current by utilizing the terminal voltage of the initial stage transistor, the necessity for adjustment of idling current is obviated. According to the invention, in contrast the conventional method to in which idling current is detected on the basis of resistance on the output terminal side of an output stage transistor, increase in the value of the current detection resistance does not bring about deterioration in characteristics such as increase in impedance.

In a case where the first and second transistors are of the same polarity, diodes connected in parallel for bypassing current during outputting of a signal are required as the current detection resistance. Since, however, these diodes do not bypass a large load current of the output stage transistor (i.e., the third or fourth transistor), small, inexpensive diodes can be used as the current detection resistance.

In one aspect of the invention, an amplifier circuit comprises a push-pull type output circuit including a first transistor and a second transistor of opposite polarities connected to each other in Darlington connection, a third transistor and a fourth transistor respectively operating complementarily with said first transistor and said second transistor and connected to each other in Darlington connection, and said second transistor and said fourth transistor being connected in series as output stage transistors between terminals of a DC power supply source, current detection resistance inserted between either said first transistor or said third transistor and said DC power supply source, error amplifying means for amplifying an error between terminal voltage of said current detection resistance and reference voltage, and biasing means responsive to output of said error amplifying means for controlling the idling current of either said first transistor or said third transistor in a negative feedback fashion.

According to this aspect of the invention, the base-emitter connection of the output stage transistor functions as a bypassing diode and, therefore, no particular bypassing diodes are required.

Embodiments of the invention will be described below with reference to the accompanying drawings.

BRIEF DESCRIPTION OF THE DRAWINGS

In the accompanying drawings.

DESCRIPTION OF PREFERRED EMBODIMENTS

Figure 1:
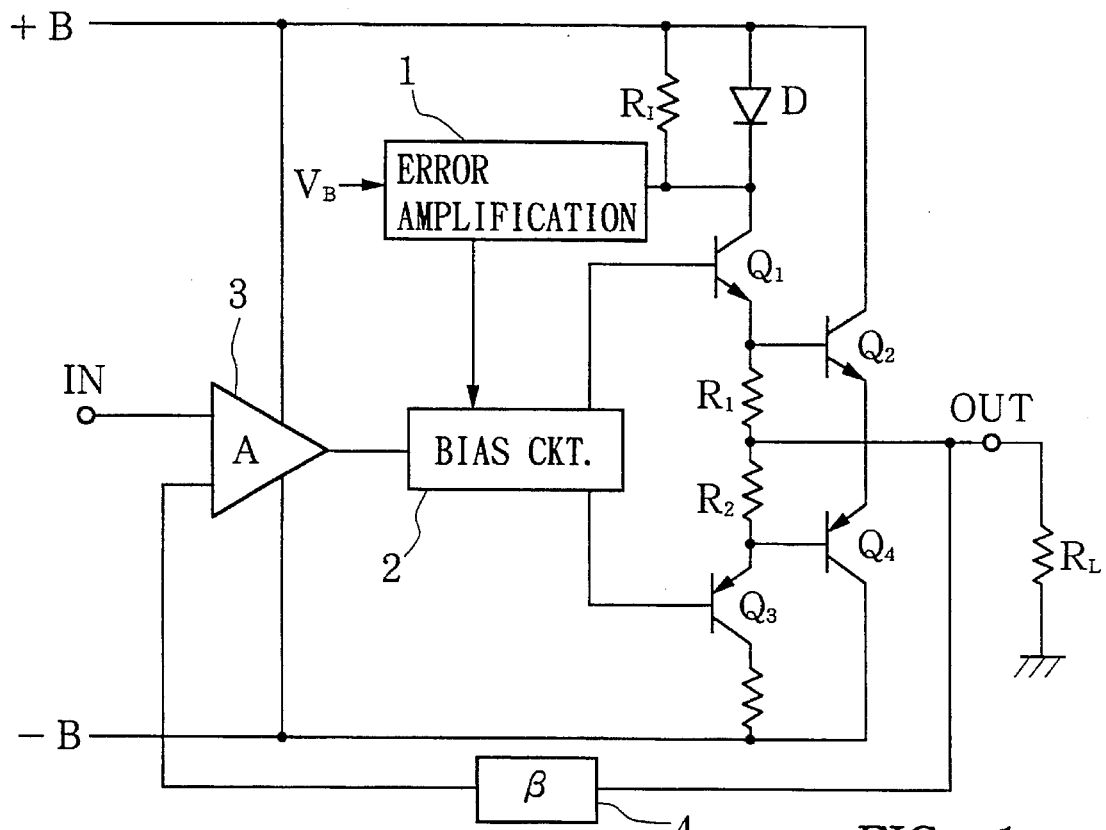
FIG. 1 is a circuit diagram showing an essential portion of an embodiment of the amplifier circuit according the invention.

Referring first to FIG. 1 showing an essential part of a first embodiment of the invention, an npn type first transistor Q1 and an npn type second transistor Q2 are connected in Darlington connection. Likewise, a pnp type third transistor Q3 and a pnp type fourth transistor Q4 are connected in Darlington connection. These transistors Q1 to Q4 constitute a push-pull type output circuit. Collectors of the output stage transistors Q2 and Q4 are connected respectively to a positive power supply source terminal +B and a negative power supply source terminal −B and emitters of these transistors Q2 and Q4 are connected commonly to an output terminal OUT.

Bias resistances R1 and R2 are respectively connected between bases and emitters of the second transistor Q2 and the fourth transistor Q4.

Current detection resistance R1 is inserted between the collector of the first transistor Q1 of the output circuit and the positive power supply source terminal +B. The collector of the third transistor Q3 is connected to the negative power supply source terminal −B. An error amplifying circuit 1 is provided for detecting idling current of this output circuit by using terminal voltage of this current detection resistance R1. A bias circuit 2 which drives the initial stage transistors Q1 and Q3 of the output circuit perform, in response to the output of the error amplifying circuit 1, a negative feedback control of bias current for determining the idling current of the output circuit.

The voltage of the output terminal OUT is negative fed back to a voltage amplifying circuit 3 by a feedback circuit 4. By this feedback circuit 4, the potential of the output terminal OUT is stabilized to a value in the vicinity of 0 V.

Figure 3:
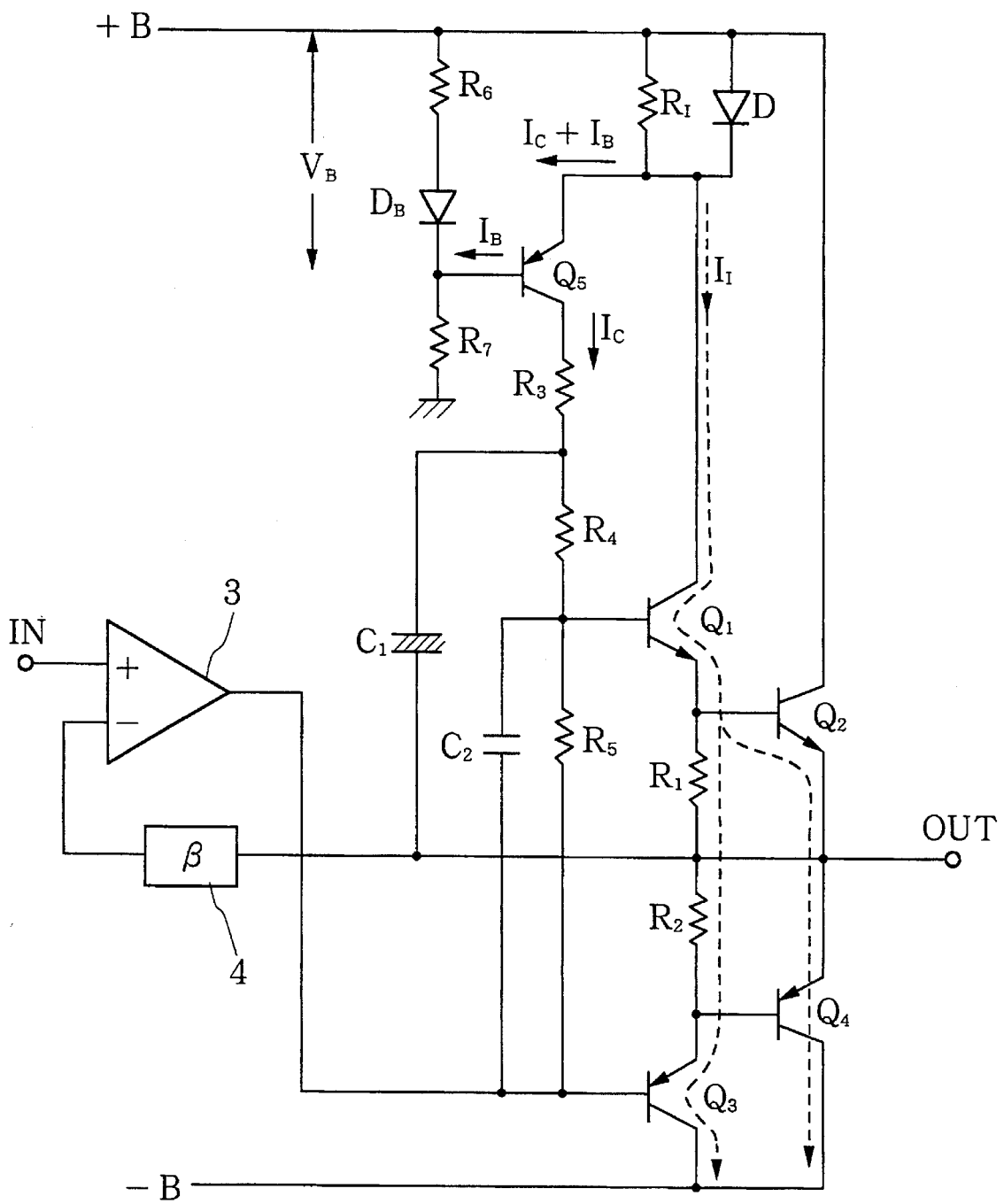
FIG. 3 is a circuit diagram showing a specific example of the circuit shown in FIG. 1.

An example of a specific circuit of the error amplifying circuit 1 and the bias circuit 2 in FIG. 1 is shown in FIG. 3. A pnp transistor Q5 whose emitter is connected to the terminal of the current detection resistance R1 and whose collector is connected to the base of the first transistor Q1 through the resistances R3 and R4 an error amplifying transistor which amplifies a difference between the terminal voltage at the current detection resistance R1 and a reference voltage. To the base of the transistor Q5 is provided a serial circuit of resistances R6 and R7 and a diode D8 which constitutes a reference voltage source. The resistance R7 causes current to flow to the resistance R6 and the diode D8 thereby to determine the base-potential of the transistor Q5. The diode D8 is provided for compensating for the base-emitter voltage of the transistor Q5 and also performing temperature compensation.

Resistance R5 is provided between the bases of the initial stage transistors Q1 and Q3 to determined bias voltage between the bases of these transistors. A boot-strap capacitor C2 is connected between the terminals of this resistance R5 to absorb variation in the bias voltage caused by turning on and off of the transistor Q5 when load is applied to the transistor Q5. A capacitor C1 is connected between the output terminal OUT and a junction of the resistances R3 and R4 for smoothing the output of the output circuit.

In this embodiment, the value of the bias resistance R1 is set in such a manner that, in an idling state, the output stage transistor Q2 of the output circuit is cut off and the output circuit is operated by the transistors Q2, Q3 and Q4. The manner of flowing of idling current I1 in this state is shown by a broken line in FIG. 3. In other word, in a light load or small signal state, the output drive is made by the transistors other than the transistor Q2 so that idling is secured and an operation is performed without causing much distortion.

When a large load is applied, the output stage transistor Q2 becomes active and a large current flows through this transistor Q2.

Alternatively, the bias resistance R2 of the other output stage transistor Q4 may be set at the same value as the bias resistance R1 so that the transistor Q4 will also become cut off in an idling state.

The operation for controlling the idling current will now be described. Let it be assumed that idling current I1 flows in the output circuit as shown in FIG. 3. In this case, collector current IC flows through the transistor Q5 in accordance with difference between voltage V1 produced across the current detection resistance R1 and reference voltage VB determined by resistance R6 and the diode DB. Change in this current IC becomes change in bias voltage VBB between bases of the initial stage transistors Q1 and Q3 of the output circuit due the bias resistance R5 and to this change in the bias voltage VBB is fed back to the change in the idling current I1. More specifically, when the idling current I1 decreases and V1=R1 I1 decreases, the forward bias of the transistor Q5 increases and the current IC thereby increases. As a result, the feedback control is performed, i.e., the bias voltage VBB increases and the idling current I1 increases. In other words, the portion including the transistor Q5 constitutes a constant current circuit for stabilizing the idling current I1 through an error amplification.

This operation will be described more specifically by using a formula. Assuming that the base emitter voltage of the transistor Q5 is VBE, the voltage across the current detection resistance R1 is expressed by $$V1 = VB - VBE \tag{1}$$

Assuming that I1 represents the idling current, IB the base current of the transistor Q5 and IC the collector current of the transistor Q5, the voltage across the current detection resistance R1 becomes $$V1 = R1\,(I1 + IC + IB) \tag{2}$$

Assuming further that the idling current I1 is sufficiently larger than the collector current IC and the base current IB is sufficiently smaller than the collector current IC, the base current IB can be neglected and, from the above equations (1) and (2), $$I1 = (VB - VBE)/R1 - IC \tag{3}$$

Since the first term of the right member of the equation (3) is constant, the relationship that the collector current IC decreases as the idling current I1 increases is established. When the collector current IC decreases, the idling current I1 decreases due to drop in the terminal voltage of the resistance R5.

As described in the foregoing, according to this embodiment, the bias condition is so set that the output stage transistor Q2 is maintained in a cut off stage in the idling state. For example, when the idling current I1 is 10 mA and the value of the resistance R1 is 33 ohms, the base emitter voltage of the output stage transistor Q2 is 0.33 V so that this transistor Q2 is cut off. By setting the value of the resistance R2 at 150 ohms, current of about 4 mA which is a part of the idling current I1 of 10 mA flows to the transistor Q3 and the remaining current of about 6 mA flows to the transistor Q4. Alternatively, a bias condition may be established so that the transistor Q4 also will be cut off in the idling state.

As described above, in the amplifier circuit of this embodiment, the stabilizing control of the idling current is automatically achieved. The idling current detection resistance R1 and the bypassing diode D are provided on the side of the transistor Q1 and the collector of the output stage transistor Q2 is connected directly to the power supply source terminal +B. The output stage transistor Q2 is turned on only when a load of a large value is applied and a large current flows at this time, Therefore, a large current does not flow through the bypassing diode D and a small, inexpensive diode can be used as the bypassing diode D.

Figure 2:
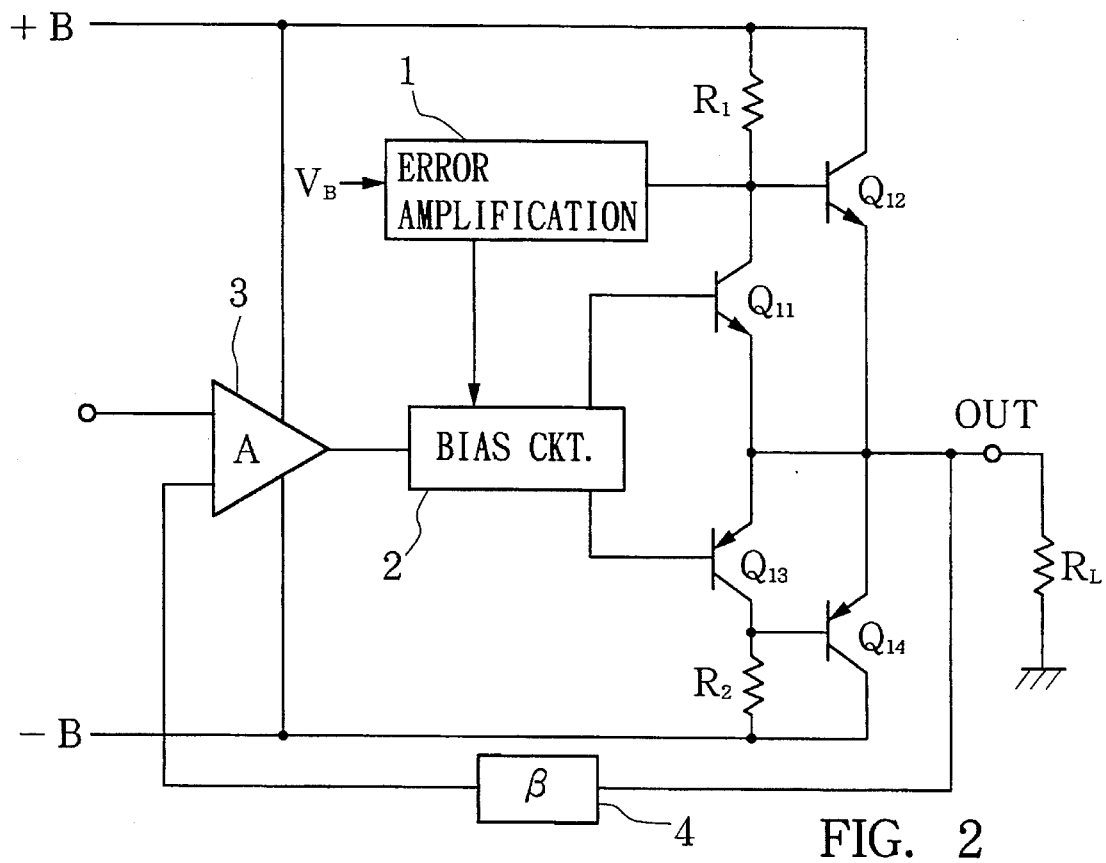
FIG. 2 is a circuit diagram showing an essential portion of another embodiment of the amplifer circuit according to the invention.

FIG. 2 is another embodiment of the amplifier circuit of the invention. Components parts corresponding to those of FIG. 1 are designated by the same reference characters as those of FIG. 1. In the embodiment of FIG. 1, the Darlington connection of the same polarity is used whereas in the embodiment of FIG. 2, a Darlington connection of opposite polarities is used. In a Darlington circuit on the positive power supply source side in the embodiment of FIG. 2, a first transistor Q11 is made of an npn transistor and a second transistor Q12 is made of a pnp transistor. In a Darlington circuit on the negative power supply source side, a third transistor Q13 is made of a pnp transistor and a fourth transistor Q14 is made of an npn transistor.

Conversely to the first embodiment, the collectors of the output stage transistors Q12 and Q14 are connected commonly to the output terminal OUT and the emitters thereof are connected to the DC power supply source terminals +B and −B. Base bias resistances R1 and R2 of the output stage transistors Q12 and Q14 are connected between the collectors of the initial stage transistors Q11 and Q13 and the power supply source terminals +B and −B and these bias resistances are used directly as the current detection resistance R1.

The bypassing diode D in FIG. 1 is omitted in this embodiment. In this embodiment, the base emitter connection of the output s rage transistor Q12 is provided in parallel to the resistance R1 and this performs the function of the bypassing diode.

Figure 4:
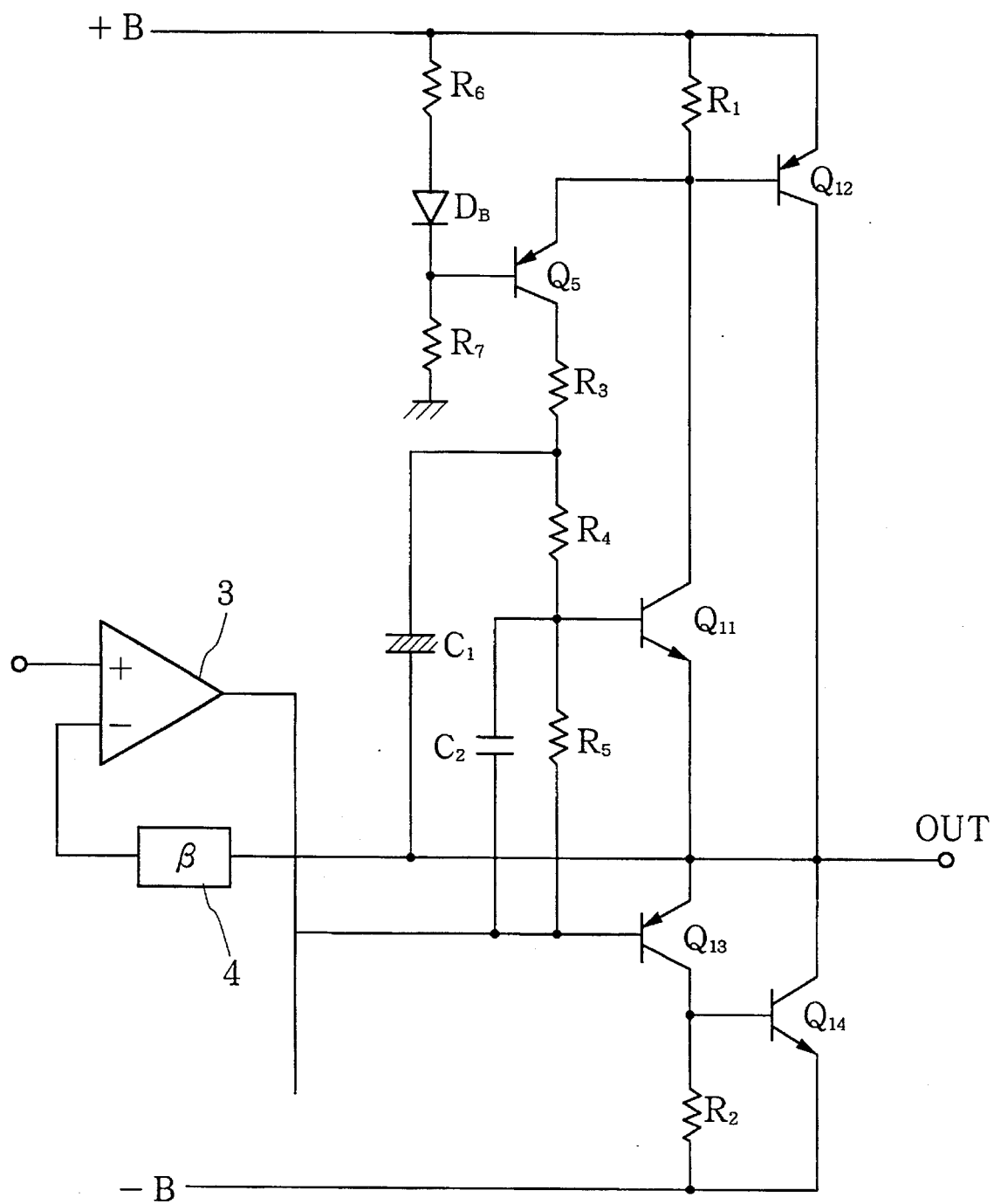
FIG. 4 is a circuit diagram showing a specific example of the circuit shown in FIG. 2.

FIG. 4 shows a specific example of the current detection circuit 1 and the bias circuit 2 in FIG. 2. The structure of these circuits is the same as the one shown in FIG. 3.

In this embodiment also, the bias condition is so set that the output stage transistors Q12 and Q14 are maintained in the cut off state in the idling state and, accordingly, the idling current flows through the initial stage transistor Q11. The detection of this idling current and its stabilizing operation are the same as those of the first embodiment.

In the embodiment of FIG. 2, the emitters of the initial stage transistors Q11 and Q13 of the output circuit are directly connected to each other. For this reason, change in the base bias of these transistors Q11 and Q13 is smaller than the first embodiment in which the resistances are inserted between the emitters and, as a result, an excellent transient response characteristic can be obtained.

Figure 5:
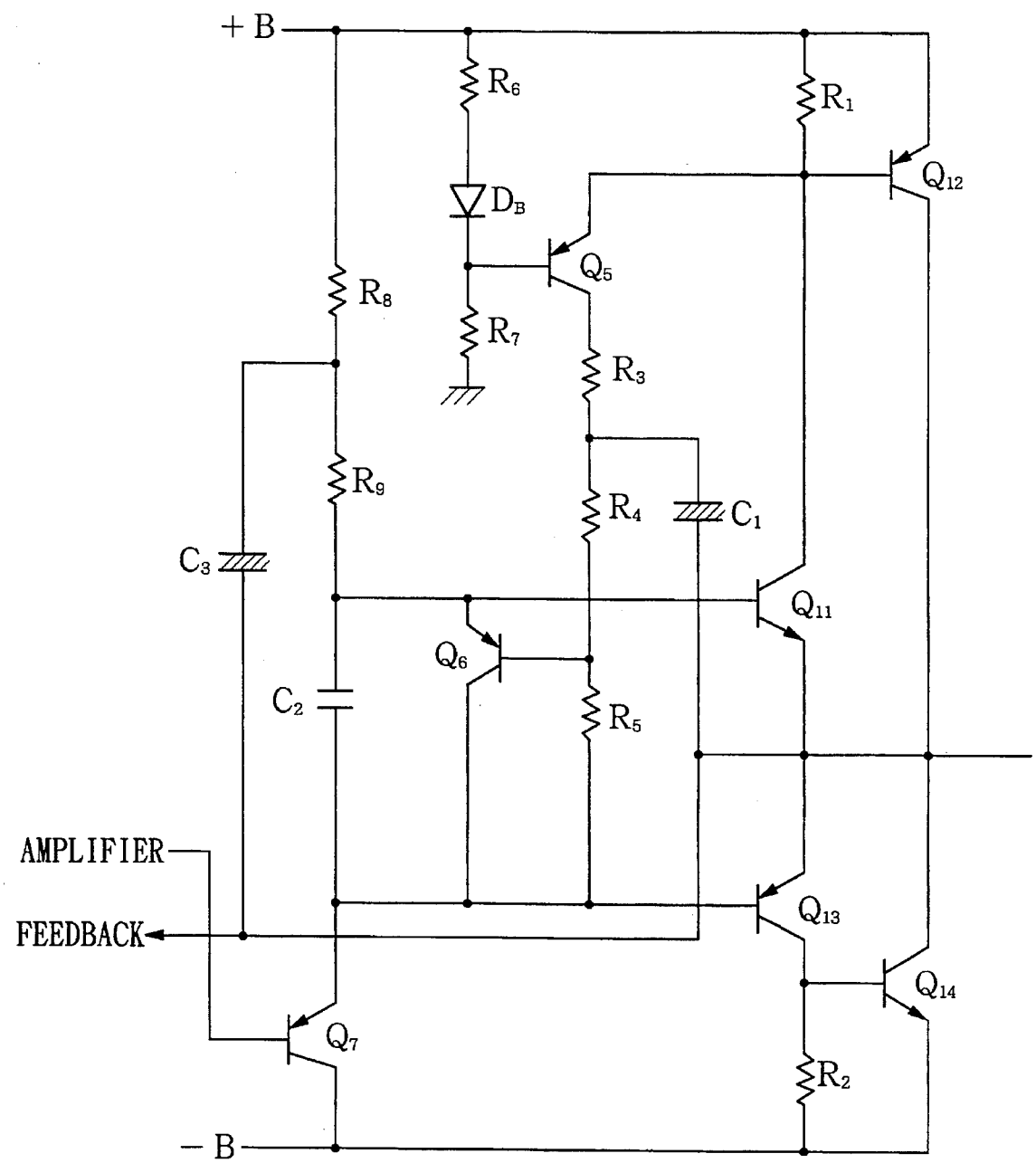
FIG. 5 is a circuit diagram showing a modified example of the example shown in FIG. 4.

FIG. 5 shows an example which is a modification of the example of FIG. 4. In the example of FIG. 4, the voltage across the resistance R5 is used directly as the bias voltage for the output circuit. In the example of FIG. 5, an active type bias circuit is constructed by using a pnp transistor Q6 for amplification. Voltage across the resistance R5 is used as the base collector bias of the transistor Q6. The emitter of the transistor Q6 is connected to the positive side DC power supply source terminal +B and also connected to the base of the transistor Q11.

According to this example, change in the collector current of the current detection transistor Q5 is amplified by the transistor Q6 and used for the bias control of the output circuit. Accordingly, response characteristic of the idling current control is further improved.

The invention is not limited to these embodiments. For example, the active type bias circuit of FIG. 5 may be applied to the example of FIG. 3. In the above described embodiments, detection of current, error amplification and feedback of bias are performed on the positive power supply source side. Alternatively, these operations can be made on the negative power supply source side. In the above described embodiments, a single transistor is used for error amplification. Alternatively, other circuit such as a differential amplifier or an operation circuit may be used as the error amplification means. These circuits may of course be designed as an integrated circuit.

What is claimed is:

1. An amplifier circuit comprising:

a push-pull type output circuit including a first transistor and a second transistor connected to each other in Darlington connection, a third transistor and a fourth transistor respectively operating complementarily and connected to each other in Darlington connection, and said second transistor and said fourth transistor being connected in series as output stage transistors between terminals of a DC power supply source;

current detection means comprising current detection resistance inserted between either said first transistor or said third transistor and said DC power supply source and detecting idling current of either said first transistor or said third transistor on the basis of terminal voltage of said current detection resistance; and biasing means responsive to output of said current detection means for controlling the idling current of either said first transistor or said third transistor in a negative feedback fashion.

2. An amplifier circuit comprising:

a push-pull type output circuit including a first transistor and a second transistor of opposite polarities connected to each other in Darlington connection, a third transistor and a fourth transistor respectively operating complementarily with said first transistor and said second transistor and connected to each other in Darlington connection, and said second transistor and said fourth transistor being connected in series as output stage transistors between terminals of a DC power supply source;

current detection resistance inserted between either said first transistor or said third transistor and said DC power supply source;

error amplifying means for amplifying an error between terminal voltage of said current detection resistance and reference voltage; and biasing means responsive to output of said error amplifying means for controlling the idling current of either said first transistor or said third transistor in a negative feedback fashion.

* * * * *